US010453757B2

United States Patent
Cheng et al.

(10) Patent No.: US 10,453,757 B2
(45) Date of Patent: Oct. 22, 2019

(54) TRANSISTOR CHANNEL

(71) Applicant: Taiwan Semiconductor Manufacturing Company, Ltd., Hsin-Chu (TW)

(72) Inventors: Yu-Hung Cheng, Tainan (TW); Ching-Wei Tsai, Hsinchu (TW); Yeur-Luen Tu, Taichung (TW); Tung-I Lin, Tainan (TW); Wei-Li Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/982,033

(22) Filed: May 17, 2018

(65) Prior Publication Data
US 2018/0269111 A1 Sep. 20, 2018

Related U.S. Application Data

(60) Division of application No. 14/581,970, filed on Jan. 6, 2015, now Pat. No. 9,978,650, which is a
(Continued)

(51) Int. Cl.
*H01L 29/267* (2006.01)
*H01L 21/8238* (2006.01)
(Continued)

(52) U.S. Cl.
CPC .. *H01L 21/823821* (2013.01); *H01L 27/0924* (2013.01); *H01L 29/66636* (2013.01);
(Continued)

(58) Field of Classification Search
CPC ....... H01L 21/8238–823835; H01L 21/02507; H01L 29/15; H01L 29/157; H01L 29/78687; H01L 29/66636
See application file for complete search history.

(56) References Cited

U.S. PATENT DOCUMENTS 4,891,329 A * 1/1990 Reisman ............. H01L 21/2007 148/33.3
5,461,250 A * 10/1995 Burghartz ......... H01L 29/66742 257/192
(Continued)

FOREIGN PATENT DOCUMENTS

KR 10-2010-0115220 7/2001
KR 10-2008-0032234 4/2008
(Continued)

OTHER PUBLICATIONS

H. Mizuta et al., "Nanosilicon for Single-Electron Devices," Current Applied Physics 4, 2003 Published by Elsevier B.V., pp. 98-101.
(Continued)

*Primary Examiner* — Eric A. Ward
*Assistant Examiner* — Eric K Ashbahian
(74) *Attorney, Agent, or Firm* — Haynes and Boone, LLP

(57) ABSTRACT

A method for fabricating a semiconductor device includes providing a first wafer comprising a substrate and a first semiconductor material layer, bonding the first wafer to a second wafer, the second wafer comprising a sacrificial layer and a second semiconductor material layer, removing the sacrificial layer, patterning the bonded wafers to create a first structure and a second structure, removing the second semiconductor material from the first structure, forming a first type of transistor in the first semiconductor material of the first structure, and forming a second type of transistor in the second semiconductor material of the second structure.

15 Claims, 12 Drawing Sheets

Related U.S. Application Data continuation-in-part of application No. 13/871,465, filed on Apr. 26, 2013, now abandoned.

(60) Provisional application No. 61/778,693, filed on Mar. 13, 2013.

(51) Int. Cl.
*H01L 27/092* (2006.01)
*H01L 29/78* (2006.01)
*H01L 29/66* (2006.01)

(52) U.S. Cl.
CPC ...... *H01L 29/66795* (2013.01); *H01L 29/785* (2013.01); *H01L 29/7848* (2013.01)

(56) References Cited

U.S. PATENT DOCUMENTS

| | | | |
|---|---|---|---|
| 5,854,501 A | 12/1998 | Kao et al. | |
| 6,627,488 B2 | 9/2003 | Lee et al. | |
| 6,914,301 B2 | 7/2005 | Bae et al. | |
| 7,034,362 B2 | 4/2006 | Rim et al. | |
| 7,393,733 B2 | 7/2008 | Currie et al. | |
| 7,535,015 B2 | 5/2009 | Ponomarev et al. | |
| 7,626,246 B2 | 12/2009 | Lochtefeld et al. | |
| 7,834,345 B2 | 11/2010 | Bhuwalka et al. | |
| 7,902,009 B2 | 3/2011 | Simonelli et al. | |
| 7,960,781 B2 | 6/2011 | Loechelt et al. | |
| 7,977,978 B2 | 7/2011 | Yin et al. | |
| 8,138,552 B2 | 3/2012 | Matsuo et al. | |
| 8,178,221 B2 | 5/2012 | Goyal et al. | |
| 8,604,550 B2 * | 12/2013 | Lee | H01L 29/66545 257/368 |
| 8,669,163 B2 | 3/2014 | Bhuwalka et al. | |
| 8,674,447 B2 | 3/2014 | Adam et al. | |
| 8,871,586 B2 | 10/2014 | Scheiper et al. | |
| 8,896,028 B2 | 11/2014 | Mitsunaga et al. | |
| 8,987,748 B2 | 3/2015 | Pal et al. | |
| 9,012,283 B2 | 4/2015 | Kanike et al. | |
| 2005/0082531 A1 * | 4/2005 | Rim | H01L 21/84 257/72 |
| 2005/0275018 A1 | 12/2005 | Venkatesan et al. | |
| 2006/0113605 A1 * | 6/2006 | Currie | H01L 21/823807 257/368 |
| 2006/0228863 A1 * | 10/2006 | Zhang | H01L 29/66636 438/300 |
| 2007/0020833 A1 * | 1/2007 | Mears | H01L 21/823807 438/197 |
| 2008/0274594 A1 * | 11/2008 | Karve | H01L 21/76283 438/153 |
| 2011/0062446 A1 * | 3/2011 | Goyal | H01L 21/02381 257/64 |
| 2011/0127614 A1 | 6/2011 | Scheiper et al. | |
| 2011/0215299 A1 * | 9/2011 | Rao | B82Y 10/00 257/28 |
| 2012/0261718 A1 * | 10/2012 | Sosa Cortes | H01L 29/41783 257/192 |
| 2012/0326168 A1 * | 12/2012 | Adam | H01L 29/66636 257/77 |
| 2013/0161639 A1 | 6/2013 | Pal et al. | |
| 2014/0264493 A1 | 9/2014 | Cheng | |

FOREIGN PATENT DOCUMENTS

| | | |
|---|---|---|
| KR | 10-2010-0115220 | 10/2010 |
| KR | 10-2011-0127525 | 11/2011 |

OTHER PUBLICATIONS

Yu-Hung Cheng et al., "Method for Forming Epitaxial Feature," U.S. Appl. No. 13/677,406, 19 pages of text, 7 pages of drawings.
Webber et al. A Novel Lcally Engineered (111) V-channel pMOSFET Architecture with Improved Drivability Characteristics for Low-Standby power (LSTP) CMOS Applications. 2005 Symposium on VLSI Technology Digest of Technical Papers. pp. 156-157.
Korean Office Action, Application No. 10-2013-0102973, dated Sep. 15, 2015, 7 pages.
Korean IPO, Office Action, Application No. 10-2013-0102973, dated Mar. 17, 2016, 15 pages with translation.
Korean IPO, Office Action, Application No. 10-2013-0102973, dated Sep. 15, 2015, 13 pages with translation.
Korean IPO, Office Action, Application No. 10-201309192973, dated Feb. 19, 2016, 14 pages with translation.
Korean IPO, Office Action, Application No. 10-2016-0036831, dated Apr. 21, 2016, 10 pages with translation.
Korean IPO, Office Action, Application No. 10-2015-0012709, dated Nov. 26, 2015, 11 pages with translation.

\* cited by examiner

TRANSISTOR CHANNEL

PRIORITY INFORMATION

This application is a divisional application of U.S. patent application Ser. No. 14/581,970, filed Jan. 6, 2015, which is a continuation-in-part of U.S. patent application Ser. No. 13/871,465 filed Apr. 26, 2013, entitled "A Semiconductor Device and Fabricating the Same," which claims the benefit of Provisional Application No. 61/778,693, filed Mar. 13, 2013, the disclosures of which are hereby incorporated by reference in their entirety.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, a three dimensional transistor, such as a fin-like field-effect transistor (FinFET), has been introduced. Although existing devices and methods of fabricating devices have been generally adequate for their intended purposes, they have not been entirely satisfactory in all respects. For example, a limitation of an effective gate length raises challenges in semiconductor device development, including with FinFETs. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
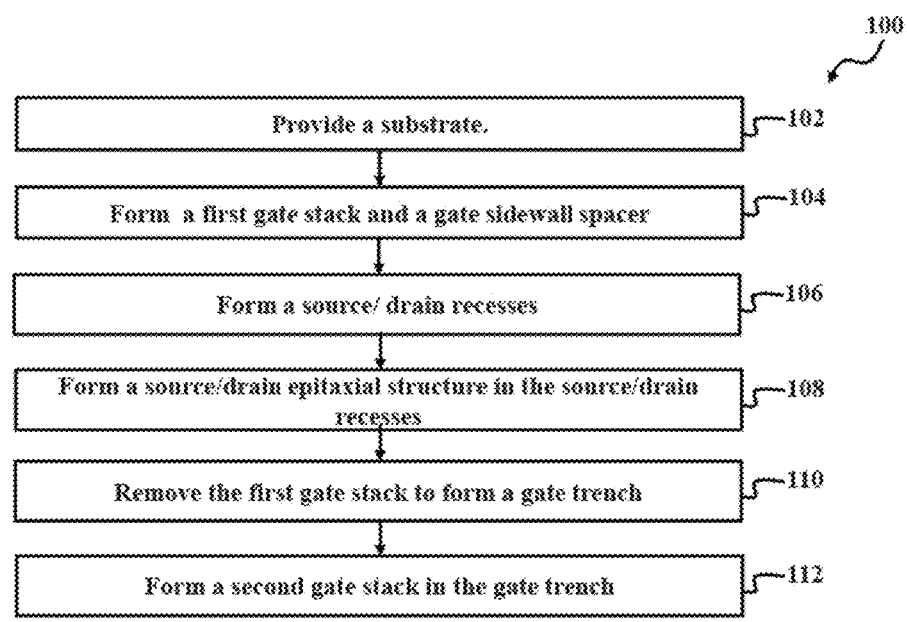
FIG. 1 is a flow chart showing an illustrative method for fabricating a semiconductor device, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of semiconductor devices that can benefit from one or more embodiments of the present application are semiconductor devices. The semiconductor device, for example, may be a complementary metal-oxide-semiconductor (CMOS) device comprising a P-type metal-oxide-semiconductor (PMOS) device and an N-type metal-oxide-semiconductor (NMOS) device. The following disclosure will continue with a semiconductor device example to illustrate various embodiments of the present application. It is understood, however, that the application should not be limited to a particular type of device, except as specifically claimed.

FIG. 1 is a flowchart of one example of a method 100 of fabricating one or more semiconductor devices according to aspects of the present disclosure. The method 100 is discussed in detail below, with reference to a semiconductor device 200 shown in FIGS. 2 to 6 for the sake of example.

Figure 2:
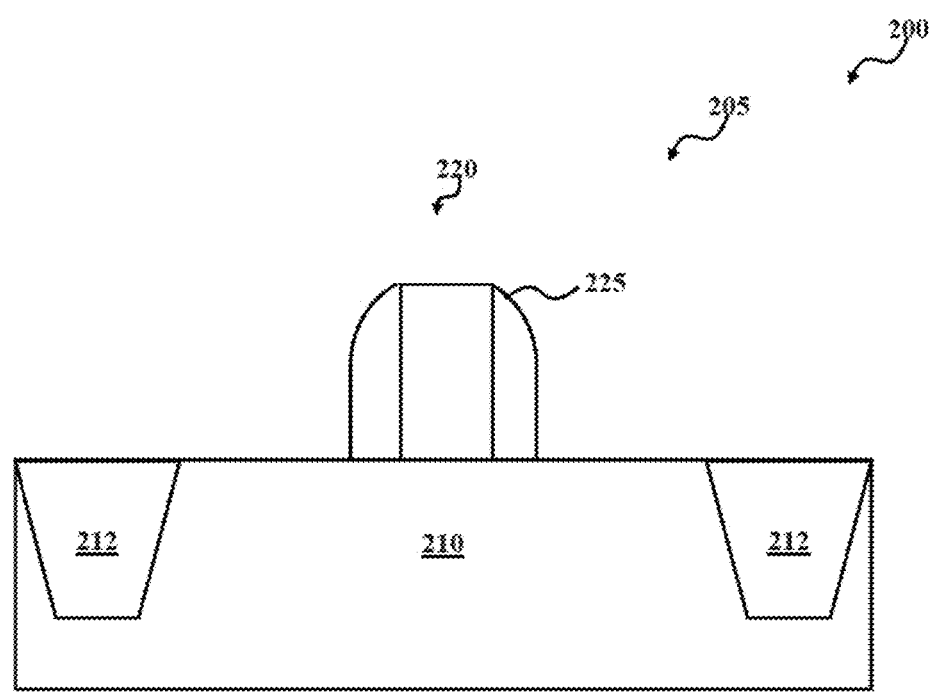
FIGS. 2-6 illustrate cross sectional views of an illustrative semiconductor device at fabrication stages described in the method of FIG. 1, according to one example of principles described herein.

Referring to FIGS. 1 and 2, the method 100 begins at step 102 by providing a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

For a FinFET, the substrate 210 may include a plurality of fins formed by any suitable process including various deposition, photolithography, and/or etching processes. For example, fins are formed by patterning and etching the substrate 210.

The substrate 210 may include isolation regions 212 to isolate active regions of the substrate 210. The isolation region 212 may be formed using traditional isolation technology, such as shallow trench isolation (STI), to define and electrically isolate the various regions. The isolation region 212 comprises silicon oxide, silicon nitride, silicon oxynitride, an air gap, other suitable materials, or combinations thereof. The isolation region 212 is formed by any suitable process. As one example, the formation of an STI includes a photolithography process, an etch process to etch a trench in the substrate (for example, by using a dry etching and/or wet etching), and a deposition to fill in the trenches (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

Referring again to FIGS. 1 and 2, the method 100 proceeds to step 104 by forming a first gate stack 220 over the substrate 210, including over (wrapping) a portion of fins in a FinFET, and a gate spacer 225 along sidewalls of the first gate stack 220. The first gate stack 220 may include a dielectric layer and a gate electrode layer. The first gate stack 220 can be formed by a procedure including deposition, photolithography patterning, and etching processes. The deposition processes may include chemical vapor deposition (CVD), physical vapor deposition (PVD), atomic layer deposition (ALD), or other suitable processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods.

In present embodiment, the first gate stack 220 is a dummy gate stack and is replaced later by a second gate stack. The dummy gate stack 220 may include the dielectric layer and the polysilicon layer.

The gate spacers 225 include a dielectric material such as silicon oxide. Alternatively, the gate spacers 225 may include silicon nitride, silicon carbide, silicon oxynitride, or combinations thereof. The gate spacers 225 may be formed by depositing a dielectric material over the first gate stack 220 and then anisotropically etching back the dielectric material.

Figure 3:
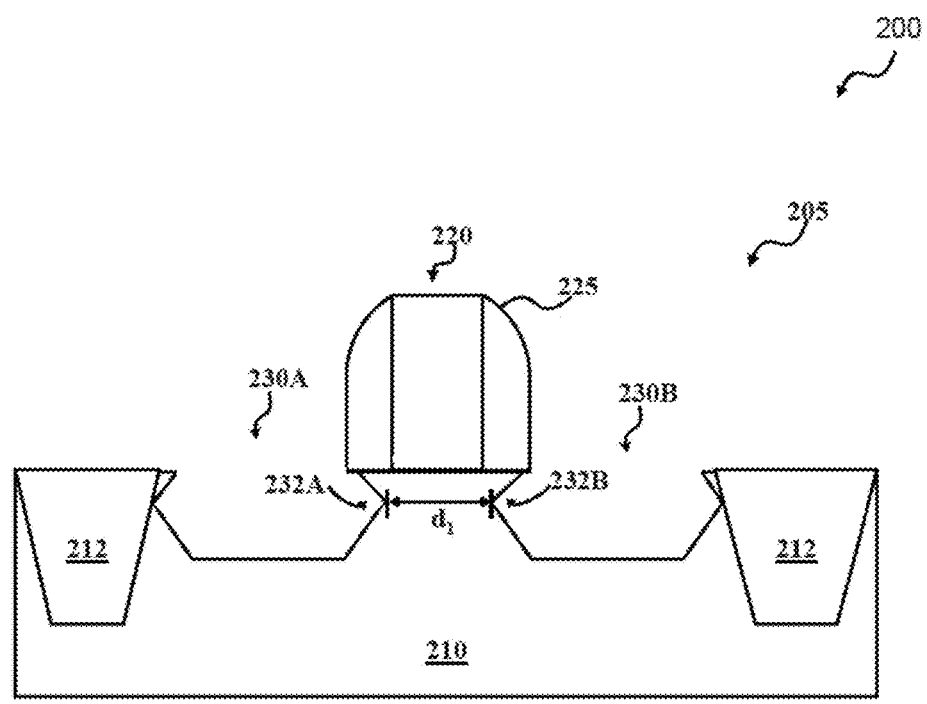

Referring to FIGS. 1 and 3, the method 100 proceeds to step 106 by removing portions of the substrate 210, including portions of fins, at either side of the first gate stack 220 to form recesses 230A and 230B (collectively referred to as recesses 230). In the depicted embodiment, the recesses 230 are formed in a source region and a drain region of the field effect transistor 205, such that the first gate stack 220 interposes the recesses 230. They are referred to as the source recess 230A and the drain recess 230B. The recessing process may include dry etching process, wet etching process, and/or combination thereof. The recessing process may also include a selective wet etch or a selective dry etch. A wet etching solution includes a tetramethylammonium hydroxide (TMAH), a HF/HNO$_3$/CH$_3$COOH solution, or other suitable solution. The dry etching process may implement fluorine-containing gas (e.g., CF$_4$, SF$_6$, CH$_2$F$_2$, CHF$_3$, and/or C2F6), chlorine-containing gas (e.g., Cl$_2$, CHCl$_3$, CCl$_4$, and/or BCl$_3$), bromine-containing gas (e.g., HBr and/or CHBR$_3$), iodine-containing gas, other suitable gases and/or plasmas, and/or combinations thereof. The etching process may include a multiple-step etching to gain etch selectivity, flexibility and desired etch profile.

The etching process is controlled to achieve a desired profile of the recesses 230A and 230B. In the present embodiment, a profile of the recess 230A and 230B is formed to have at least one vertex 232A and 232B, respectively, of facets directed towards the first gate stack 220, as illustrated in FIG. 3. As an example, the vertex 232A is formed by two Si facets having (111) crystallographic orientation. A first distance d1 is defined as the distance between two nearest source and drain vertexes, 232A and 232B. In the present embodiment, the gate 220 with sidewall spacers 225 has a width greater than 30 nm, and the first distance d1 is equal or less than 40 nm. Although shown as points in the figures, in some embodiments, the source and drain vertexes, 232A and 232B can be rounded, and have a width that is equal to or less than 10 nm. As an example, the rounded vertex can be achieved by post recess-etch thermal anneal (the process temperature and pressure are >700 C and <100 torr, respectively.).

Figure 4:
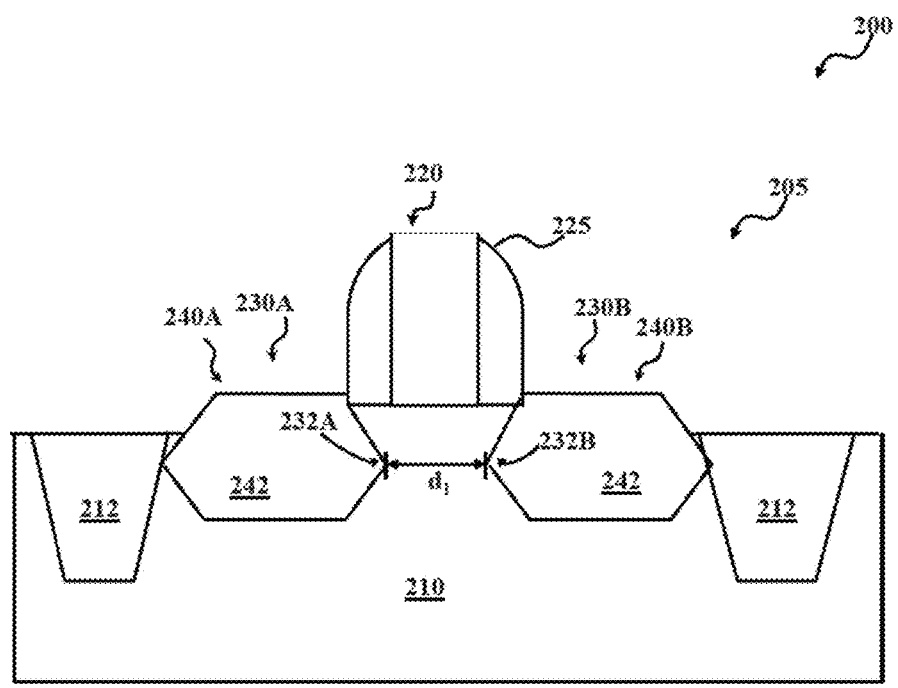

Referring to FIGS. 1 and 4, the method 100 proceeds to step 108 by forming epitaxial structures 240A and 240B (collectively referred to as epitaxial structures 240) in recesses 230A and 230B, respectively. In the present embodiment, the epitaxial structures 240 include a source/drain structure. The source/drain epitaxial structures 240 are formed by epitaxially growing a semiconductor material 242 in recesses 230. As a result, at least a portion of the source/drain epitaxial structure 240 has the same profile as the recesses 230.

The semiconductor material 242 includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). In one embodiment the semiconductor material 242 is different than the material of the substrate 210. The source/drain epitaxial structures 240 have a suitable crystallographic orientation (e.g., a (100), (110), (111) or (311) crystallographic orientation). In an example, where an NFET device is desired, the source/drain epitaxial structures 240 may include an epitaxially growing silicon (epi Si, or Si:C) 242. In another example where a PPFET device is desired, source/drain epitaxial structures 240 may include an epitaxially growing silicon germanium (SiGe) 242. Si:C and SiGe can provide tensile and compressive strains to channel through S/D vertexs. The source/drain epitaxial structures 240 may be formed by one or more epitaxy or epitaxial (epi) processes. The epitaxial processes may include CVD deposition techniques (e.g., selective epitaxy growth (SEG), vapor-phase epitaxy (VPE) and/or ultra-high vacuum CVD (UHV-CVD)), molecular beam epitaxy, and/or other suitable processes.

The source/drain epitaxial structures 240 may be in-situ doped or undoped during the epi process. For example, the epitaxially grown SiGe source/drain features 240 may be doped with boron; and the epitaxially grown Si epi source/drain features may be doped with carbon, phosphorous, or both. If the source/drain epitaxial structures 240 are not in-situ doped, a second implantation process (e.g., a junction implant process) is performed to dope the source/drain epitaxial structures 240. One or more annealing processes may be performed to activate source/drain dopants in the epitaxial structures. The annealing processes may include rapid thermal annealing (RTA) and/or laser annealing processes.

Figure 5A:
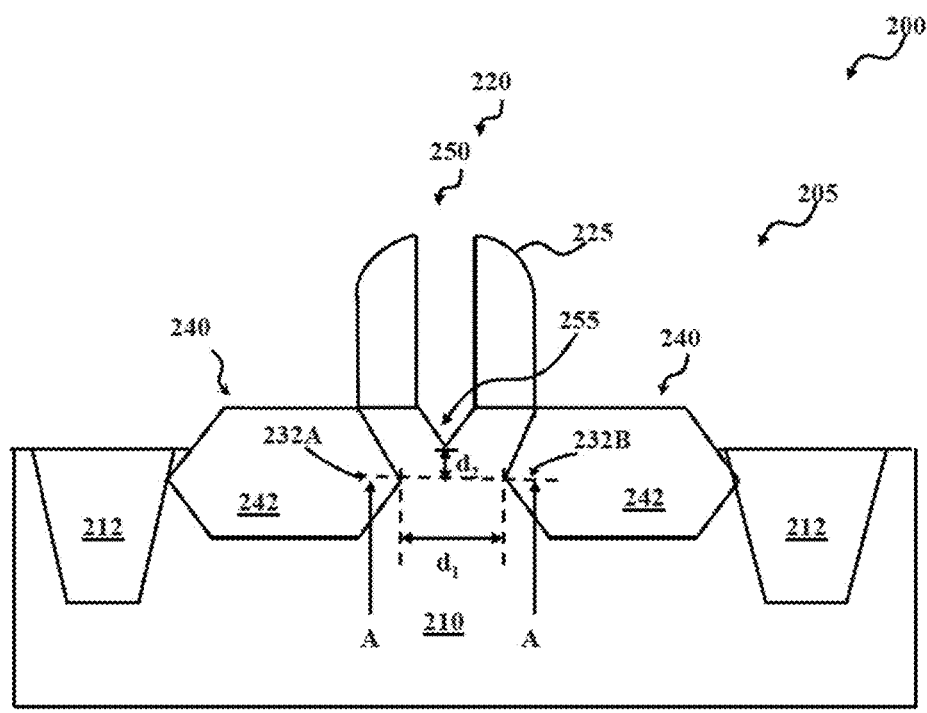

Referring to FIGS. 1 and 5A, the method 100 proceeds to step 110 by removing the first gate stack 220 and further etching the substrate 210, including fins, to form a gate trench 250. The etching processes may include selective wet etch or selective dry etch, such that having an adequate etch selectivity with respect to the gate spacer 225. The etching process may be similar in many respects to those discussed above in association with FIG. 3. In the present embodiment, the gate trench 250 is formed with a profile having at least one gate vertex 255. In one embodiment, the gate vertex 255 is formed at a bottom of the gate trench 250 by two (111) facets of the Si substrate 210. In the present embodiment, a second perpendicular distance d2 between the gate vertex 255 and a horizontal line A-A connecting the source and drain vertexes, 232A and 232B is equal to or less than 30 nm. Although shown as a point in the figures, in some embodiments, the gate vertex 255 can be rounded, and have a width that is equal to or less than 10 nm. As an example, the rounded vertex can be achieve by post recess-etch thermal anneal (temperature>700 C at lower pressure (<100 torr)).

Figure 5B:
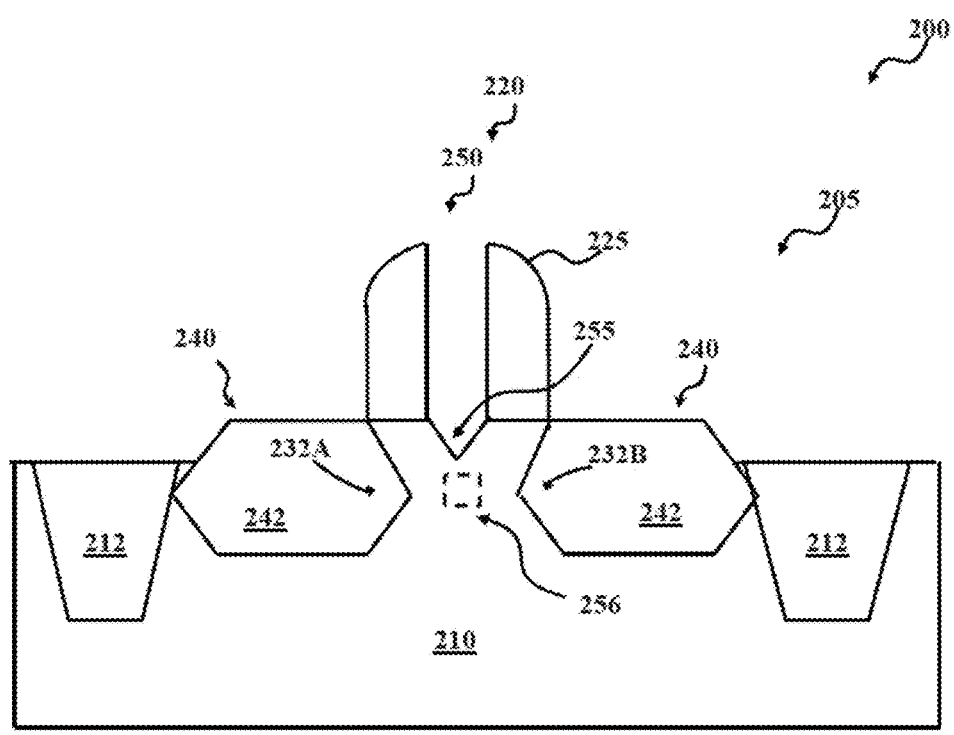

In another embodiment, after forming the gate trench 250, an ion-implantation is performed to dope a targeted region 256 in the substrate 210, located between the gate vertex 255, the source vertex 232A and drain vertex 232B, as shown in FIG. 5B.

Figure 6:
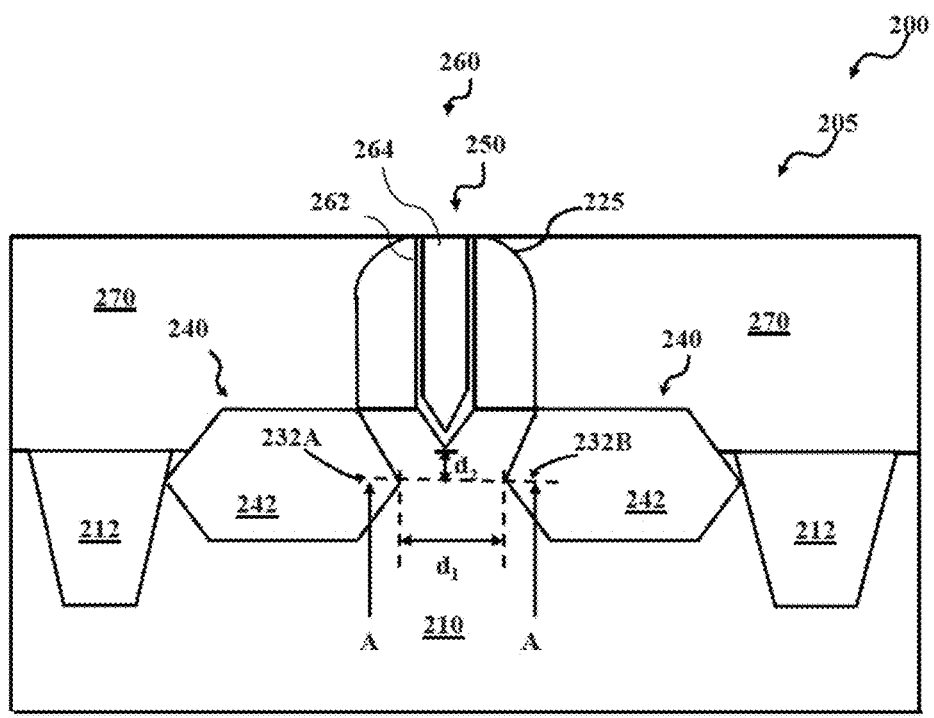

Referring to FIGS. 1 and 6, the method 100 proceeds to step 112 by forming a second gate stack 260 in the gate trench 250. The second gate stack 260 may include a dielectric layer 262 and a gate electrode layer 264. It is understood that the gate stack may include additional layers such as interfacial layers, capping layers, diffusion/barrier layers, dielectric layers, conductive layers, other suitable layers, and/or combinations thereof. For example, the dielectric 262 may include an interfacial layer (IL) and a gate dielectric layer. An exemplary IL includes silicon oxide (e.g., thermal oxide or chemical oxide) and/or silicon oxynitride (SiON). The gate dielectric layer may include a dielectric material, such as silicon oxide, silicon nitride, silicon oxynitride, high-k dielectric material, other suitable dielectric material, and/or combinations thereof. Examples of high-k dielectric material includes $HfO_2$, HfSiO, HfSiON, HfTaO, HfTiO, HfZrO, zirconium oxide, aluminum oxide, hafnium dioxide-alumina ($HfO_2$—$Al2O_3$) alloy, other suitable high-k dielectric materials, and/or combinations thereof.

The gate electrode layer 264 includes any suitable material, such as polysilicon, aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate dielectric layer 262 and gate electrode layer 264 may be deposited by chemical vapor deposition (CVD), physical vapor deposition (PVD), atomic layer deposition (ALD), or other suitable methods, and/or combinations thereof.

A dielectric layer 270 is deposited over the substrate 210, including over the source/drain epitaxial structures 240 and the second gate stack 250. The dielectric layer 270 includes silicon oxide, silicon nitride, silicon carbide, oxynitride or other suitable materials. The dielectric layer 270 is deposited by a suitable technique, such as CVD, ALD, PVD, thermal oxidation, or combinations thereof. Additionally, a CMP process is performed to planarize the top surface of the second gate stack 260 and the dielectric layer 270.

Additional steps can be provided before, during, and after the method 100, and some of the steps described can be replaced, eliminated, or moved around for additional embodiments of the method 100. The IC device 200 may include additional features, which may be formed by subsequent processing. For example, various contacts/vias/lines and multilayer interconnect features (e.g., metal layers and interlayer dielectrics) may be formed over the substrate, configured to connect the various features or structures of the IC devices 200. For example, a multilayer interconnection includes vertical interconnects, such as conventional vias or contacts, and horizontal interconnects, such as metal lines. The various interconnection features may implement various conductive materials including copper, tungsten, and/or silicide.

Based on the above, the present disclosure presents a semiconductor device and fabrication. The semiconductor device employs vertex structures for each of gate stack, source and drain structures. Vertexes of the gate, source and drain are formed to be separated with a quite small distance to each other. The semiconductor device also has an option of having a doped region located between vertexes of the gate stack, the source and the drain. Thus semiconductor device can work as a tunneling device, or a single electron transistor (SET), and demonstrates advances of small gate length, low Vt, low power consumption.

Figure 7A:
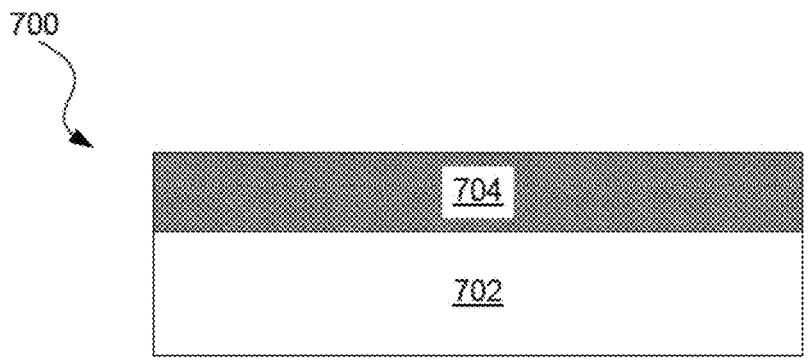
FIGS. 7A-7H are diagrams showing an illustrative process for forming embedded channels for transistor devices, according to one example of principles described herein.

FIGS. 7A-7H are diagrams showing an illustrative process for forming embedded channels for transistor devices. FIG. 7A illustrates a first wafer 700 that includes a semiconductor substrate 702 having a first semiconductor material layer 704 formed thereon. The semiconductor substrate 702 may be, for example, a silicon-on insulator (SOI) substrate. Such a substrate may include a semiconductor layer, an insulator layer such as an oxide layer, and another semiconductor layer.

The first semiconductor material 704 is a semiconductor material that may be designed for an NMOS transistor. Thus, the semiconductor type may have an N-type conductivity. The first semiconductor material 704 is chosen such that the channel region is able to be properly strained in order to enhance the corresponding mobility, such as tensile strain in the channel region of the NMOS transistor in the present example. The first semiconductor material 704 may be made of silicon germanium (SiGe) in one example. The first semiconductor material 704 may be epitaxially grown on the semiconductor substrate 702. In one example, the first semiconductor material 704 may be formed using a low pressure chemical vapor deposition (LPCVD) process. Such process may take place at a temperature within a range of about 800-1100 degrees Celsius. The process may take place at a pressure within a range of about 1-600 torr.

Figure 7B:
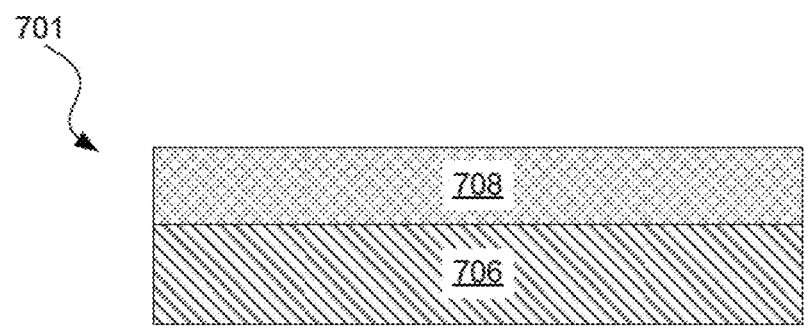

FIG. 7B is a diagram showing a second wafer 701 that is to eventually be bonded to the first wafer 700. The second wafer 701 includes a sacrificial substrate 706 and a second semiconductor material layer 708. The sacrificial substrate 706 is referred to as such because, as will be described below, it will eventually be removed. The sacrificial substrate 706 may be made of, for example, indium phosphorous (InP).

The second semiconductor material 708 may be designed for a PMOS transistor device. Thus, the second semiconductor material may have a P-type conductivity. The second semiconductor material 708 is chosen such that a channel region formed therein is able to be properly strained in order to enhance the corresponding mobility, such as compressive strains in the channel region of the PMOS transistor in the present example. The second semiconductor material 708 may be made of, for example, indium gallium arsenide (InGaAs). The second semiconductor material layer 708 may be formed through an epitaxial process. The second semiconductor material layer 708 may be formed using a metal-organic chemical vapor deposition (MOCVD) process. Such a process may occur at temperature within a range of about 500-700 degrees Celsius. Such a process may occur at a pressure of about 75 torr.

Figure 7C:
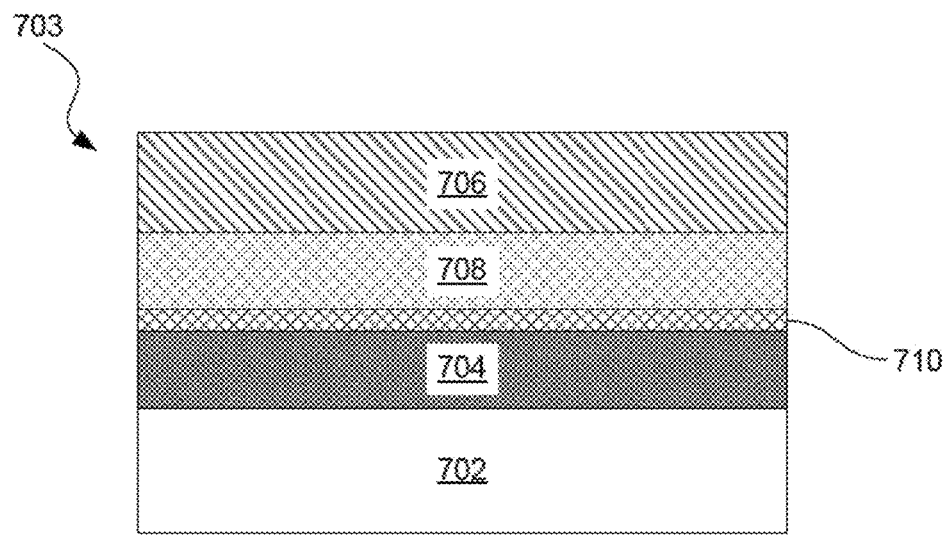

FIG. 7C is a diagram showing a combined wafer 703 after a bonding of the first wafer 700 and the second wafer 701. The bonding is performed such that the second semiconductor material 708 is bonded to the first semiconductor material 704 with a bonding layer 710. Before the bonding occurs, a surface passivation process can be applied to the second semiconductor material layer 708, depending on the type of material used for the second semiconductor material layer 708. Additionally, a plasma post oxidation process can be performed on the first channel layer material 704, depending on the type of material used for the first semiconductor material layer 704. The bonding layer 710, which is applied before the bonding process occurs, may be made of aluminum oxide ($Al_2O_3$). The bonding layer 710 may be applied to either wafer 700, 701 through atomic layer deposition (ALD).

Figure 7D:
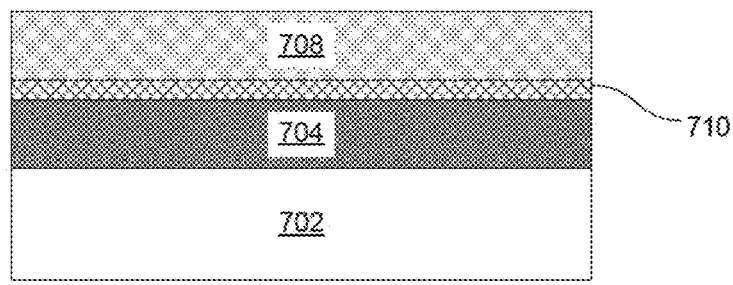

FIG. 7D is a diagram showing removal of the sacrificial substrate 706. The sacrificial substrate 706 is removed after the bonding process is complete. The sacrificial substrate 706 can be removed using a wet etch process. For example, a hydrochloric acid may be used to remove the sacrificial substrate 706.

Figure 7E:
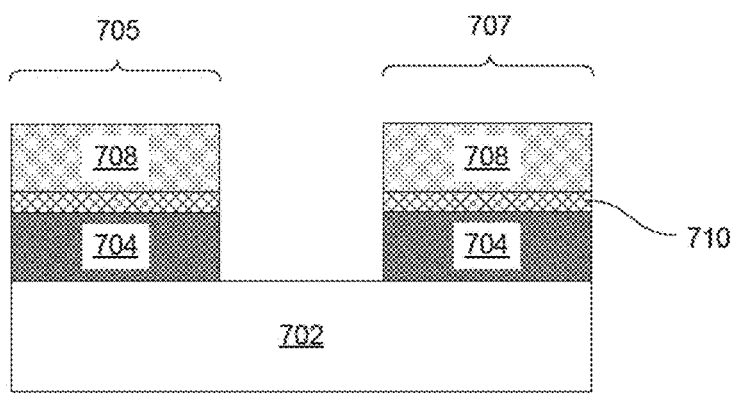

FIG. 7E is a diagram showing patterning of the combined wafer 703 to form a first structure in a first region 705 and a second structure in a second region 707. Through subsequent processes, the first structure in the first region 705 will become a first transistor device and the second structure in the second region 707 will become a second transistor device. Particularly, the first structure will become an NMOS device and the second structure will become a PMOS device. The combined wafer 703 may be patterned using various photolithographic techniques. For example, a photoresist may be used to form the desired pattern. Then, an anisotropic etching process, such as a dry etching process can be used to remove portions of the combined wafer that are exposed according to the pattern. The etching gas used for such an etching process may be a mix of chlorine and nitrogen or a mix of chlorine and argon. The bias power used for the etching process may be below 25 watts.

Figure 7F:
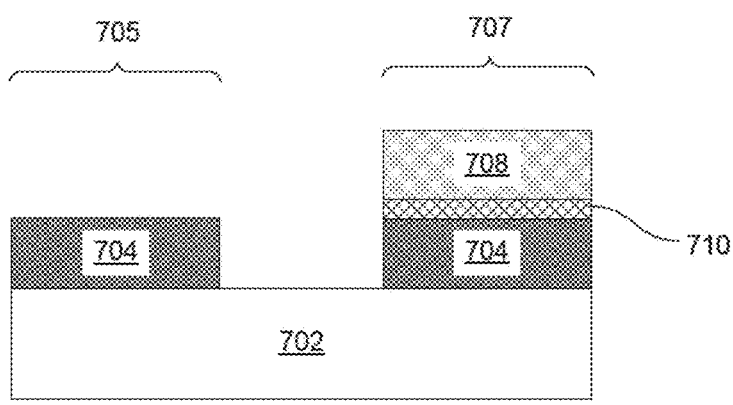

FIG. 7F is a diagram showing removal of the second semiconductor material 708 and the bonding layer 710 from the first structure in the first region 705. Thus, the first semiconductor material layer 704 in the first region 705 is exposed. Removal of the second semiconductor material 708 may involve various photolithographic techniques. For example, photoresist can be used to cover the second region 707 and other features of the wafer that are not intended to have the second semiconductor material layer 708 removed. Then, a wet etching process can be used to remove the exposed portions of the second semiconductor material layer 708. The wet etching process may include one of a variety of wet etching solutions such as HCl or $H_3PO_4$.

Figure 7G:
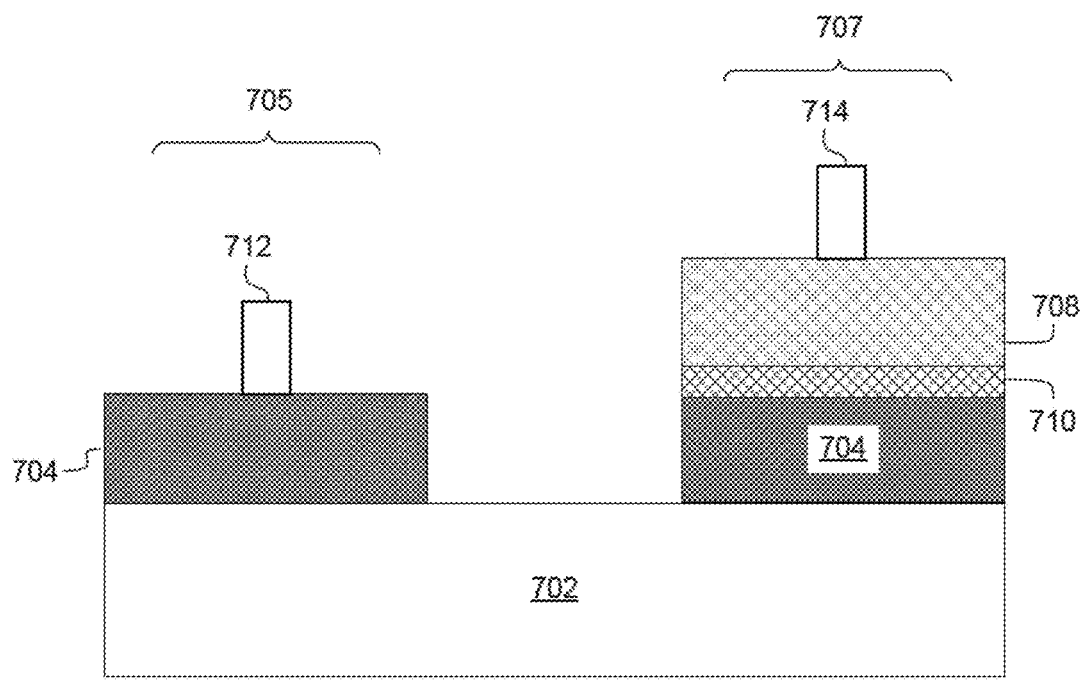

FIG. 7G is a diagram showing formation of gate structures 712, 716. Particularly, a first gate 712 is formed in the first region 705 and a second gate 716 is formed in the second region 707. The gate structures 712, 716 may be formed by various fabrication techniques. In one example, the gate structures 712, 716 may be formed in a manner similar to the gate device described above with respect to FIGS. 2-6. Particularly, in some examples, the gate structures 712, 716 may include a gate vertex as described above.

Figure 7H:
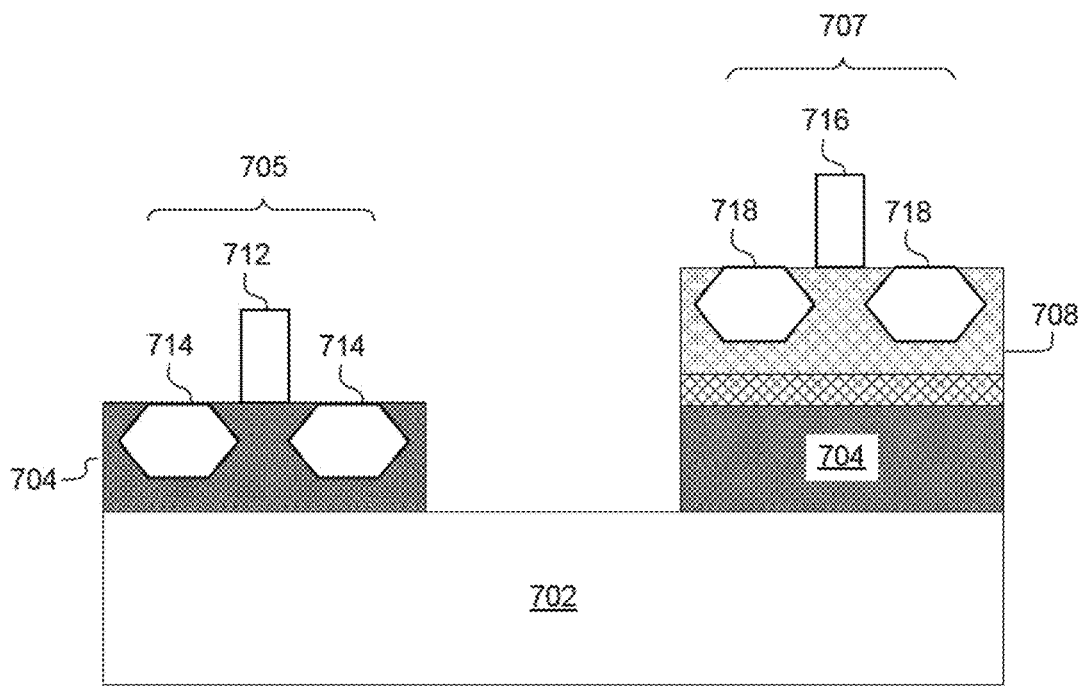

FIG. 7H is a diagram showing formation of source/drain regions 714, 718. Particularly, source/drain regions 714 are formed within the first semiconductor material layer 704 in the first region 705 and source/drain regions 718 are formed in the second semiconductor material layer 708 in the second region 707. The source/drain regions 714, 718 are formed by first removing portions of the underlying semiconductor material and then deposition the source/drain material within the removed portion.

Source/drain regions 714 can be formed by removing portions of the first semiconductor material layer 704 to form recesses on both sides of the gate 712. Material may be removed by using an anisotropic etching process such as a dry etching process in addition to a wet etching process such as TMAH wet etching, or a combination of both. The removal process may be a multi-step process to obtain the desired profile. After the removal process, there will be recesses formed in a shape such that a tip will face towards the channel region underneath the gate 712. Those recesses may then be filled with the source/drain material. The source/drain material may be silicon germanium doped with a dopant for a PMOS device such as Boron. The source/drain regions 714 may be formed through an LPCVD process that utilizes a silicon germanium based precursor gas as well as a gas containing the desired type of dopant such as $B_2H_6$. The LPCVD process may take place at a temperature within a range of about 300-800 degrees Celsius and at a pressure within a range of about 1-500 torr.

Source/drain regions 718 can be formed by removing portions of the second semiconductor material layer 708 to form recesses on both sides of the gate 716. Material may be removed by using multistep wet etching processes that use various wet etchants such as $H_3PO_4$, $H_2O_2$, and HCl or a mixture thereof. Dry etching processes may be used as well. After the removal process, there will be recesses formed in a shape such that a tip will face towards the channel region underneath the gate 716. Those recesses may then be filled with the source drain material. The source/drain material may be silicon germanium doped with a dopant for a NMOS device such as phosphorous. The source/drain regions 718 may be formed through an LPCVD process that utilizes a silicon germanium based precursor gas as well as a gas containing the desired type of dopant such as PH3 or AsH3. The LPCVD process may take place at a temperature within a range of about 300-800 degrees Celsius and at a pressure within a range of about 1-500 torr.

FIG. 7H illustrates a structure in which an NMOS device 705 and a PMOS device 707 are formed adjacent to each other. The PMOS device 707 is on a different level than the NMOS device 705. Specifically, the PMOS device 707 is on a higher level than the NMOS device 705 with respect to the substrate 702. It is understood that the features of FIG. 7H do not necessarily include all features that may be part of a transistor within an integrated circuit. For example, additional dielectric layers, metal contacts, and other features are part of the transistor device.

Use of principles described herein provides a number of advantages. For example, using specific types of channel materials for NMOS and PMOS devices can provide more efficient transistors. Specifically, the specific types of materials can lower the tunneling barrier and thus the voltage threshold. An integrated circuit made of such transistors can consume less power during operation.

For example, for an NMOS transistor, using a silicon germanium channel and source drain regions made of doped silicon germanium, there is less lattice mismatch between the channel and the source/drain regions. This leads to fewer dislocations within the source/drain regions. Similarly, for a PMOS transistor, using indium gallium arsenide as a channel material and using doped silicon germanium for the source/drain regions, there is also less lattice mismatch.

Figure 8:
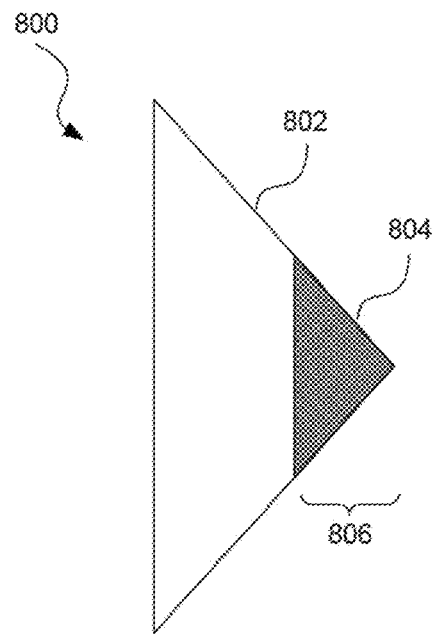
FIG. 8 is a diagram showing an illustrative tip with a higher dopant concentration, according to one example of principles described herein.

FIG. 8 is a diagram 800 showing an illustrative tip 804 with a higher dopant concentration than the remaining portion 802 of the source/drain region. As described above, the source/drain regions having a vertex pointing towards the channel. For example, in the case of a PMOS device having source/drain regions doped with boron, there is a higher concentration of boron at the tip 804 of the device. The tips 804 with a higher dopant concentration may be formed before the remaining portion 802 of the source/drain region is formed. Specifically, after a portion of the semiconductor material is removed and before the source/drain material is deposited within the recess, the higher concentrated tips 804 can be formed within the recess at the appropriate location. In one example, the thickness 806 of the higher dopant concentrated tips 804 is about 5 nanometers.

Figure 9:
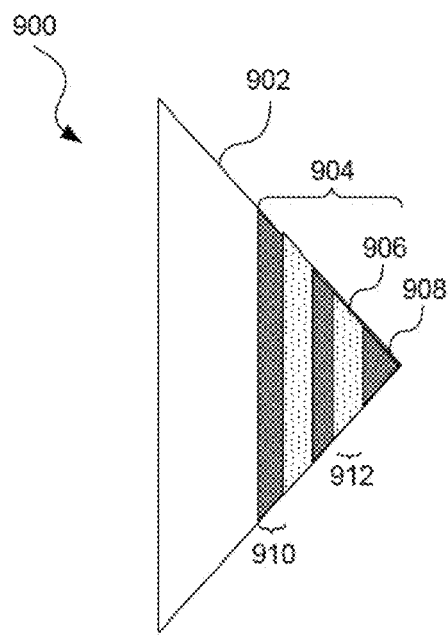
FIG. 9 is a diagram showing an illustrative tip with a superlattice structure, according to one example of principles described herein.

FIG. 9 is a diagram 900 showing an illustrative tip 904 with a superlattice structure. The remaining portions 902 of the source/drain region may be the normal source/drain material. A superlattice structure alternates between two types of semiconductor material. Specifically, the superlattice structure alternates between a first type of material 906 and a second type of material 908. For example, in the case of a PMOS device, the first material 906 may be silicon germanium doped with boron and the second material 908 may be silicon doped with boron. In the case of a NMOS device, the first material 906 may be silicon germanium without dopant and the second material 908 may be silicon doped with phosphorous. In some cases, the two different materials 906, 908 may both be doped silicon germanium but with two different concentrations of germanium. The thickness 910, 912 of each section of material may be about 3 nanometers.

Using the techniques above with respect to the tips of the source/drain regions, current can be more efficiently directed through the channel. This allows the tunneling voltage to be further reduced, thus allowing the transistor to operate on less power.

Figure 10:
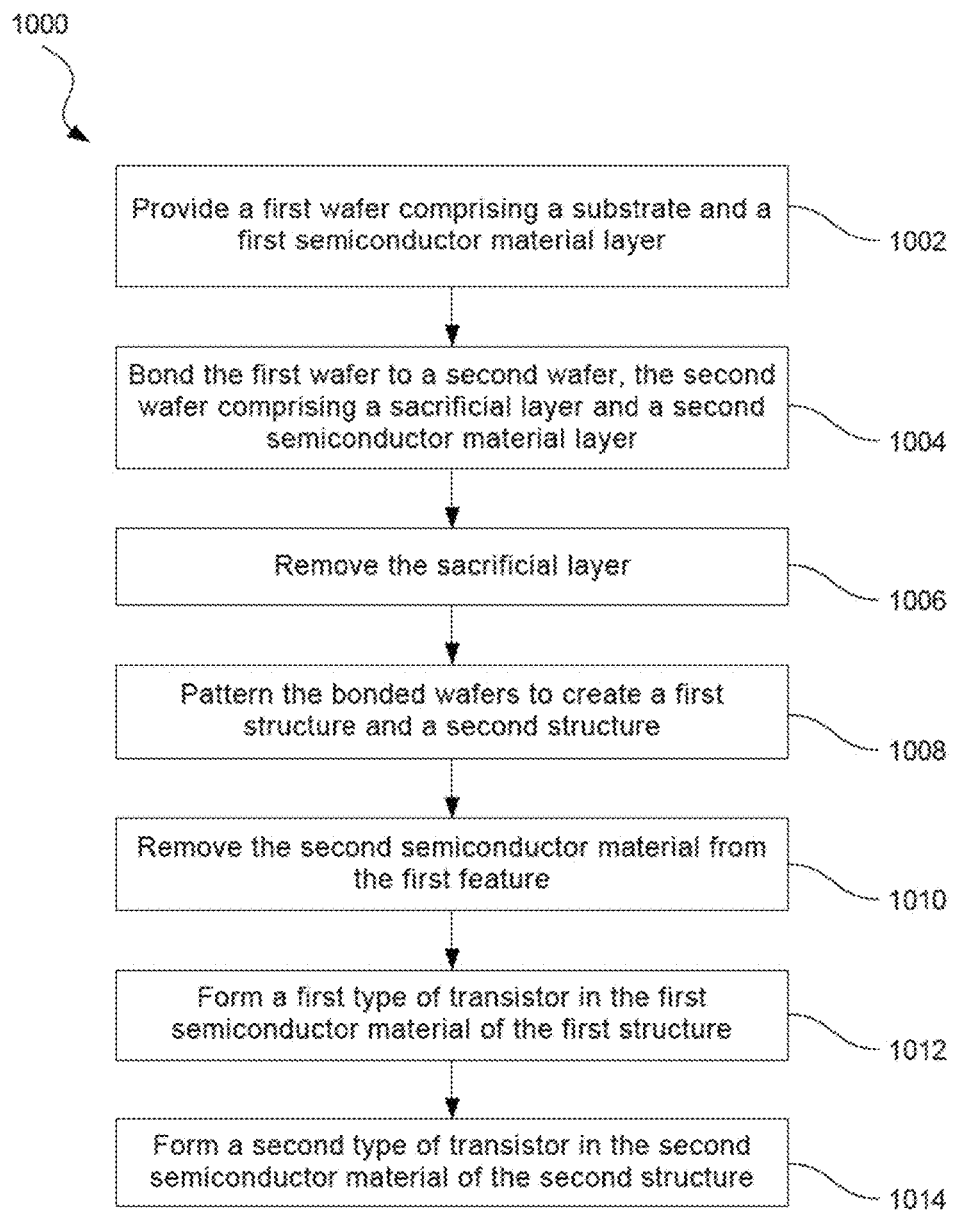
FIG. 10 is a flowchart showing an illustrative method for forming a transistor with an improved channel, according to one example of principles described herein.

FIG. 10 is a flowchart showing an illustrative method for forming a transistor with an improved channel. According to the present example, the method 1000 may be used to form the structure illustrated in FIG. 7H. The method 1000 includes a step 1002 for providing a first wafer comprising a semiconductor layer and a first semiconductor material layer. The semiconductor layer may be a silicon-on-insulator substrate. The first semiconductor material layer may be a material intended for use in an NMOS device.

The method 1000 further includes a step 1004 for bonding the first wafer to a second wafer, the second wafer comprising a sacrificial layer and a second semiconductor material layer. The second channel layer may be a material intended for use in a PMOS device. The method further includes a step 1006 for removing the sacrificial layer. This is done after the wafers have been bonded.

The method 1000 further includes a step 1008 for patterning the bonded substrates to create a first structure in a first region and a second structure in a second region. The first structure is used to form the NMOS device and the second structure is used to form the PMOS device. The method 1000 further includes a step 1010 for removing the second semiconductor material from the first feature. This exposes the first semiconductor material.

The method 1000 further includes a step 1012 for forming a first type of transistor in the first semiconductor material in the first region. This involves forming a gate device and source/drain regions adjacent to the gate device. The source/drain regions may be formed such that they have vertexes that point towards the channel region underneath the gate. The transistor device may have features as described in FIGS. 2-9.

The method 1000 further includes a step 1014 for forming a second type of transistor in the second semiconductor material in the second region. This involves forming a gate device and source/drain regions adjacent to the gate device. The source/drain regions may be formed such that they have vertexes that point towards the channel region underneath the gate.

According to one example, a transistor device includes a substrate having a first region and a second region, a first semiconductor layer of a first semiconductor material having a first portion over the first region and a second portion over the second region, the first portion being separated from the second portion. The device further includes a second semiconductor layer of a second semiconductor material over the second portion of the first semiconductor layer, a first transistor of a first conductivity type, the first transistor disposed within the first region and having a first set of source/drain regions formed in the first semiconductor layer, and a second transistor of a second conductivity type, the second transistor disposed within the second region and having a second set of source/drain regions formed in the second semiconductor layer. The second conductivity type is different than the second conductivity type, and the second semiconductor material is different from the first semiconductor material.

According to one example, a transistor device includes a gate device, a source region having a vertex pointing towards a channel beneath the gate device, and a drain region having a vertex pointing towards the channel. A tip at the vertex of the source region and a tip at the vertex of the drain region comprise a superlattice structure.

According to one example, a method for fabricating a semiconductor device includes providing a first wafer comprising a substrate and a first semiconductor material layer, bonding the first wafer to a second wafer, the second wafer comprising a sacrificial layer and a second semiconductor material layer, removing the sacrificial layer, patterning the bonded wafers to create a first structure and a second structure, removing the second semiconductor material from the first structure, forming a first type of transistor in the first semiconductor material of the first structure, and forming a second type of transistor in the second semiconductor material of the second structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
   providing a first wafer comprising a substrate and epitaxially growing a first semiconductor material layer over the substrate;
   providing a second wafer, epitaxially growing a second semiconductor material layer on a sacrificial layer of the second wafer;
   bonding the first wafer to the second wafer, wherein the bonding the first wafer to the second wafer including bonding the first semiconductor material layer to the second semiconductor material layer;
   after the bonding, removing the sacrificial layer by a wet etching process;
   patterning the bonded first wafer and second wafer to create a first structure and a second structure;
   removing the second semiconductor material layer from the first structure;
   forming a first type of transistor in the first semiconductor material layer of the first structure wherein the forming the first type of transistor in the first semiconductor material layer includes:
      removing a portion of the first semiconductor material layer,
      forming a source/drain material in a first region defined by the removed portion, wherein the first region has a shape with a tip extending toward a channel region under a gate structure of the first type of transistor; and
      forming a higher concentration of a dopant of boron in the tip of the first region than a remaining portion of the first region; and
   forming a second type of transistor in the second semiconductor material layer of the second structure.

2. The method of claim 1, further comprising forming a superlattice structure in the second type of transistor, wherein the superlattice structure alternates between two different semiconductor materials wherein the alternating is in a direction that is substantially parallel to a top surface of the substrate, the two different semiconductor materials having a same type of dopant.

3. The method of claim 1, wherein forming the first type of transistor and the second type of transistor comprises epitaxially growing source/drain regions within the first semiconductor material layer and the second semiconductor material layer, the source/drain regions having edges defined by facets and vertexes pointed towards a region underneath a gate device.

4. The method of claim 1, wherein bonding the first wafer to the second wafer includes applying a bonding layer by atomic layer deposition (ALD) between the first semiconductor material layer and the second semiconductor material layer.

5. The method of claim 4, wherein the bonding layer is aluminum oxide ($Al_2O_3$).

6. The method of claim 1, wherein the forming the second type of transistor in the second semiconductor material layer includes removing a second portion of the second semiconductor material layer and forming another source/drain material in a second region defined by the removed second portion.

7. A method for fabricating a semiconductor device, the method comprising:
   providing a first substrate and a first semiconductor material layer;
   providing a second substrate and a second semiconductor material layer, the second semiconductor material layer different in composition than the first semiconductor material layer;
   bonding the first semiconductor material layer to the second semiconductor material layer by applying a bonding layer between the first and second semiconductor material layers;
   patterning the bonded first semiconductor material layer and second semiconductor material layer to create a first structure having the first semiconductor material layer and a second structure having the first semiconductor material layer, the bonding layer, and the second semiconductor material layer;
   forming a first type of transistor in the first semiconductor material layer of the first structure including forming a source/drain region for the first type of transistor that has a superlattice structure that alternates between two different semiconductor materials wherein the alternating is in a direction that is substantially parallel to a top surface of the first substrate, the two different semiconductor materials having a same type of dopant; and
   forming a second type of transistor in the second semiconductor material layer of the second structure.

8. The method of claim 7, wherein the patterning the bonded first semiconductor material layer and second semiconductor material layer includes removing the second semiconductor material layer from a region including the first structure.

9. The method of claim 7, wherein the forming the source/drain region of the first type of transistor includes etching a recess in the first semiconductor material layer, wherein the recess has a profile providing a tip facing a channel region under a gate of the first type of transistor, the superlattice structure is formed in the recess.

10. A method for fabricating a semiconductor device, the method comprising:
   providing a first stack and a second stack over a substrate, each of the first stack and second stack including a first semiconductor material layer, a bonding layer, and a second semiconductor material layer, wherein the first stack is a spaced a distance from the second stack;
   removing the second semiconductor material layer and the bonding layer from the first stack exposing the first semiconductor material layer;
   forming a first gate structure on the first semiconductor material layer of the first stack and etching a first set of recesses in the first semiconductor material layer, wherein the etching the first set of recesses includes forming a recess defined by a first edge along a facet of a first crystalline orientation and a second edge along another facet of the first crystalline orientation, the first and second edges meeting in a vertex;
   forming a second gate structure on the second semiconductor material layer of the second stack and etching a second set of recesses in the second semiconductor material layer; and
   filling each of the first set of recesses and the second set of recesses with source/drain material; wherein the filling the first set of recesses includes filling each of the first set of recesses having a first dopant concentration at a center of the recess and a second dopant concentration the vertex, wherein the second dopant concentration is greater than the first dopant concentration, the first and second dopant concentrations greater than zero and wherein the first dopant concentration and the second dopant concentration are of boron.

11. The method of claim 10, wherein the filling each of the first set of recesses and the second set of recesses includes providing a first material in the first set of recesses and a second material, different than the first material in the second set of recesses.

12. The method of claim 10, wherein the filling the second set of recesses includes forming a superlattice structure in each of the second set of recesses.

13. The method of claim 10, wherein the filling of the second set of recesses includes filling the recess having a higher dopant concentration toward the vertex.

14. The method of claim 10, further comprising:
 rounding the vertex by annealing the substrate after etching the first set of recesses.

15. The method of claim 10, wherein the first crystalline orientation is (111).

\* \* \* \* \*